United States Patent
Miyazaki et al.

(10) Patent No.: US 8,345,193 B2
(45) Date of Patent: Jan. 1, 2013

(54) FLEXIBLE ELECTRONIC DEVICE AND FLEXIBLE DISPLAY DEVICE

(75) Inventors: Takashi Miyazaki, Kawasaki (JP); Hajime Yamaguchi, Kawasaki (JP); Masao Tanaka, Sagamihara (JP); Kentaro Miura, Yokohama (JP); Rei Hasegawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 386 days.

(21) Appl. No.: 12/557,883

(22) Filed: Sep. 11, 2009

(65) Prior Publication Data

US 2010/0066970 A1    Mar. 18, 2010

(30) Foreign Application Priority Data

Sep. 12, 2008    (JP) .................. 2008-234838

(51) Int. Cl.
  *G02F 1/1333*    (2006.01)
(52) U.S. Cl. ...................... 349/122; 349/158
(58) Field of Classification Search .................. 349/122, 349/158
  See application file for complete search history.

(56) References Cited

U.S. PATENT DOCUMENTS

2005/0088595 A1*    4/2005    Akiyama et al. .............. 349/122

FOREIGN PATENT DOCUMENTS

| JP | A-2003-280035 | 10/2003 |
|---|---|---|
| JP | 2004-46792 | 2/2004 |
| JP | 2007-88235 | 4/2007 |
| JP | A-2007-207910 | 8/2007 |
| WO | WO 02089553 A1 * | 11/2002 |
| WO | WO-2006/011418 | 2/2006 |

OTHER PUBLICATIONS

David J. Gundlach et al., "High-Mobility, Low Voltage Organic Thin Film Transistors", Tech. Dig.-Int. Electron Devices Meet, 1999, pp. 111-114.
Thomas N. Jackson et al., "Organic Thin Film Transistors for Flexible-Substrate Displays", SID'00 Dig., 2000, pp. 411-414.
Stan Drobac, "Fluidic Self-Assembly Could Change the Way FPDs Are Made", SID'99 Dig., 1999, pp. 12-16.
Japanese Office Action issued in corresponding Japanese Patent Application No. 2008-234838, mailed on Jul. 17, 2012 (with English translation).

* cited by examiner

*Primary Examiner* — Wen-Ying P Chen
(74) *Attorney, Agent, or Firm* — Oblon, Spivak, McClelland, Maier & Neustadt, L.L.P.

(57) ABSTRACT

An electronic device including: a thin-film substrate having a front surface being formed with electronic circuits; an adhesive layer comprising an adhesive material applied to a back surface of the thin-film substrate, the adhesive material having an elasticity modulus being in a range of $1.0 \times 10^3$ to $2.1 \times 10^4$ Pa at 80° C.; and a flexible substrate having a front surface being bonded to the back surface of the thin-film substrate with the adhesive layer.

7 Claims, 3 Drawing Sheets

FLEXIBLE ELECTRONIC DEVICE AND FLEXIBLE DISPLAY DEVICE

CROSS-REFERENCE TO THE RELATED APPLICATION(S)

The present disclosure relates to the subject matters contained in Japanese Patent Application No. 2008-234838 filed on Sep. 12, 2008, which are incorporated herein by reference in its entirety.

FIELD

The present invention relates to a flexible electronic device and a flexible display device which are formed by using a transfer method.

BACKGROUND

In recent years, technological development has been being made extensively about flexible electronic devices having high flexibility. Examples of such flexible electronic devices are a device as typified by an IC card which is formed by transferring a transfer subject substrate which is a thin-film silicon wafer formed with integrated circuits (ICs) to a transfer destination substrate which is a flexible resin substrate and a flexible liquid crystal display device, which is light in weight and less prone to break, and is formed by transferring a thin-film transfer subject substrate formed with thin-film transistors (TFTs) to a transfer destination substrate which is a flexible resin substrate. In particular, a human interface device in which a displacement, a displacement speed, or the like of a bend of the display device is detected as a variation in electrical property and a desired image is displayed according to the detected variation is known as an example of such a flexible liquid crystal display device. For example, in a case where an e-book is configured by using this display device, it is possible to change the image that is displayed on the display device by performing a page turning-over operation on the display device. An example of such device is disclosed in JP-A-2004-046792.

In general, such a flexible electronic device which is high in flexibility is configured by a method called a transfer method (refer to JP-A-2007-088235, for example) The transfer method is the following method. Electronic circuits are formed in advance on an inorganic substrate that is high is heat resistance. Then, a thin-film transfer subject substrate is formed by peeling a surface layer that is formed with the circuits off the inorganic substrate or thinning the inorganic substrate which is formed with the circuits from the back side by etching or the like. The back surface of the thus-formed thin-film transfer subject substrate is coated with an adhesive layer and the transfer subject substrate is bonded to the front surface of a transfer destination substrate.

Incidentally, to construct a flexible electronic device that is as thin as paper by the above-described transfer method, it is necessary that the transfer method be implemented by a process that is executed at as low a temperature as possible because the transfer destination substrate is mainly made of plastics which is low in heat resistance.

Among known methods for constructing a flexible electronic device by the transfer method as implemented by a low-temperature process are the following methods.

In one method, an organic semiconductor is used which can be formed by an ordinary temperature/pressure process such as spin coating or printing. An example of such method is disclosed in the following documents (1) and (2).

Document (1): D. Gundlach et al., Tech. Dig.-Int. Electron Devices Meet. (1999), pp. 111-114.

Document (2): T. N. Jackson et al., SID '00 Dig. (2000), pp. 411-414

Another method (called FSA) is as follows. A single crystal silicon wafer on which semiconductor circuits or semiconductor integrated circuits are formed is cut into chips, which are dispersed in a fluid. A plastic substrate having recesses at prescribed positions is immersed in the fluid, whereby single-crystal chips are fitted into the recesses in a self-aligned manner. An example of such method is disclosed in the following document (3).

Document (3): S. Drobac, SID '99 Dig. (1999), pp. 12-16

In particular, the method disclosed in the document (3) is effective because no limitations are imposed on the material of the transfer destination substrate and low-melting-point materials such as plastics can be used.

However, electronic devices produced by the above-described transfer method have a problem that when they are stored at high temperature cracks may develop in the transfer subject substrate because of thermal stress occurring parallel with the boundary surface due to a difference between the thermal expansion coefficients of the transfer subject substrate and the transfer destination substrate.

SUMMARY

According to an aspect of the invention, there is provided an electronic device including: a thin-film substrate having a front surface being formed with electronic circuits; an adhesive layer comprising an adhesive material applied to a back surface of the thin-film substrate, the adhesive material having an elasticity modulus being in a range of $1.0 \times 10^3$ to $2.1 \times 10^4$ Pa at 80° C.; and a flexible substrate having a front surface being bonded to the back surface of the thin-film substrate with the adhesive layer.

According to another aspect of the invention, there is provided a display device including: a thin-film substrate having a front surface being formed with thin-film transistors; an adhesive layer comprising an adhesive material applied to a back surface of the thin-film substrate, the adhesive material having an elasticity modulus being in a range of $1.0 \times 10^3$ to $2.1 \times 10^4$ Pa at 80° C.; and a flexible substrate having a front surface being bonded to the back surface of the thin-film substrate with the adhesive layer.

BRIEF DESCRIPTION OF THE DRAWINGS

A general configuration that implements the various feature of the invention will be described with reference to the drawings. The drawings and the associated descriptions are provided to illustrate embodiments of the invention and not to limit the scope of the invention.

DETAILED DESCRIPTION OF THE EMBODIMENTS

Figure 1:
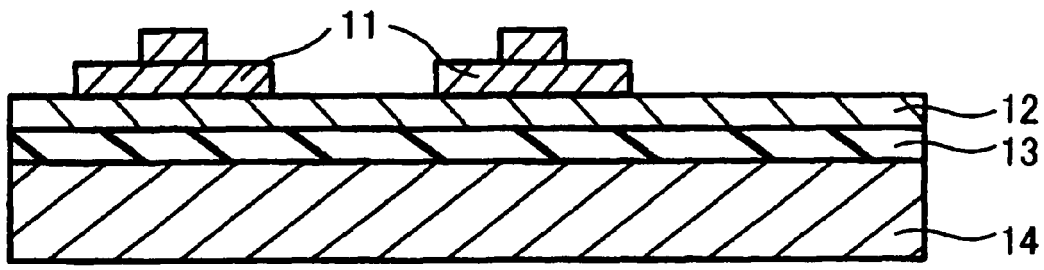
FIG. 1 is a sectional view showing the structure of a flexible electronic device according to a first embodiment.

Hereinafter, an embodiment of the invention will be described with reference to the drawings. In the following description, the same or similar components will be denoted by the same reference numerals, and the duplicate description thereof will be omitted.

First Embodiment

FIG. 1 is a sectional view showing the structure of a flexible electronic device according to a first embodiment of the invention.

As shown in FIG. 1, the flexible electronic device according to the first embodiment is configured in such a manner that the back surface of a thin-film transfer subject substrate 12 whose front surface is formed with electronic circuits 11 is bonded to the front surface of a transfer destination substrate 14 with an adhesive layer 13.

In the flexible electronic device, the transfer destination substrate 14 is flexible and is a resin sheet or an insulative inorganic film, for example. The resin sheet is a resin film of PES (poly(ether sulphone)), PEN (poly)ethylene naphthalate)), COP (cycloolefin polymer), PMMA (poly(methyl methacrylate)), or PS (polystyrene), or PP (polypropylene). The insulative inorganic film is a silicon oxide film, a silicon nitride film, or the like that takes the form of a thin metal foil.

For example, as described later, the thin-film transfer subject substrate 12 whose front surface is formed with the electronic circuits 11 is formed by thinning an original transfer subject substrate by etching until it becomes flexible. The back surface of the thin-film transfer subject substrate 12 is the etched surface of the original transfer subject substrate. Alternatively, the thin-film transfer subject substrate 12 may be formed by thinning an original transfer subject substrate by melting its back-side layer or by peeling off a surface layer of an original transfer subject substrate by applying laser light to it from its back side. In the latter case, the back surface of the thin-film transfer subject substrate 12 is its peeling surface.

In the flexible electronic device according to the embodiment, the adhesive layer 13 made of an adhesive material including an adhesive or a viscous adhesive whose elasticity modulus is in the range of $1.0 \times 10^3$ to $2.1 \times 10^4$ Pa at 80° C. is provided by coating between the back surface of the thin-film transfer subject substrate 12 and the front surface of the transfer destination substrate 14.

Figure 2:
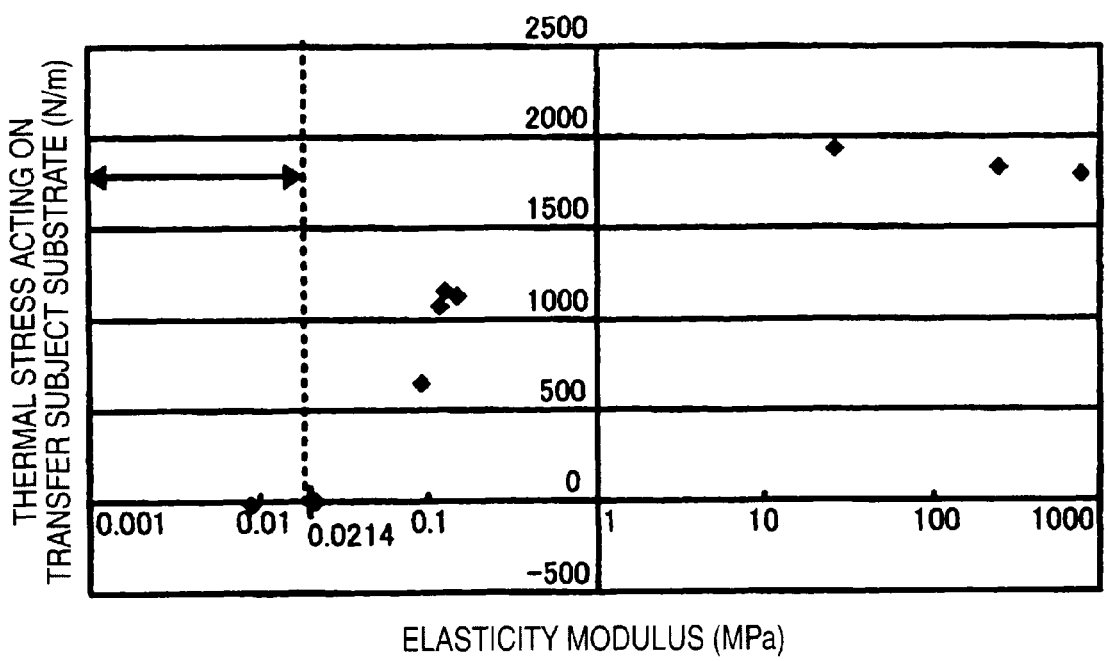
FIG. 2 is a graph showing a relationship between the elasticity modulus of an adhesive layer and the thermal stress acting on a transfer subject substrate.

FIG. 2 is a graph showing a measurement result of thermal stress acting on the thin-film transfer subject substrate 12 when electronic devices were heated to 80° C. Each electronic device was produced by coating, with the adhesive layer 13, the back surface of the thin-film transfer subject substrate 12 which was a silicon wafer and the back surface of the thin-film transfer subject substrate 12 was bonded to the front surface of the transfer destination substrate 14 which was a flexible PES (poly ether sulphone) resin film. In FIG. 2, the horizontal axis represents the elasticity modulus in MPa of the adhesive layer 13 and the vertical axis represents the thermal stress in N/m acting on the thin-film transfer subject substrate 12. In FIG. 2, the point having an elasticity modulus value 0.009 MPa corresponds to a case that the adhesive layer 13 was made of a silicone gel and all the other points correspond to a case that the adhesive layer 13 was made of an acrylic adhesive or viscous adhesive.

It is seen from FIG. 12 that the thermal stress acting on the thin-film transfer subject substrate 12 decreases steeply around an elasticity module value (of the adhesive layer 13) of $1.0 \times 10^5$ Pa. It is also seen that the thermal stress acting on the thin-film transfer subject substrate 12 becomes approximately equal to zero when the thermal stress of the adhesive layer 13 is $2.14 \times 10^4$ Pa or less. The former result is explained as follows: when the elasticity modulus of the adhesive layer 13 is around $1.0 \times 10^5$ Pa, the thermal stress that occurs due to the difference between the thermal expansion coefficients of the transfer destination substrate 14 and the thin-film transfer subject substrate 12 is reduced through deformation of the adhesive layer 13. The latter result is explained as follows: when the elasticity modulus of the adhesive layer 13 is $2.14 \times 10^4$ Pa or less, the thermal stress that occurs due to the difference between the thermal expansion coefficients of the transfer destination substrate 14 can be eliminated almost completely because of the same mechanism. It is thus concluded that the thermal stress acting on the thin-film transfer subject substrate 12 can be eliminated almost completely by using the adhesive layer 13 whose elasticity modulus is $2.14 \times 10^4$ Pa or less.

However, if a flexible electronic device is produced by bonding the transfer subject substrate 12 to the transfer destination substrate 14 with the adhesive layer 13 whose elasticity modulus is extremely smaller than $2.14 \times 10^4$ Pa, the flexible electronic device would be low in reliability because of a relative positional deviation between the transfer subject substrate 12 and the transfer destination substrate 14. To suppress such deviation, it is preferable that the elasticity modulus be larger than or equal to $1.0 \times 10^3$ Pa.

The elasticity modulus range of the adhesive layer 13 used in the embodiment is determined for the above-described reasons. A result similar to the result of FIG. 2 is obtained when the thin-film transfer subject substrate 12 is an inorganic substrate such as a glass substrate instead of a silicon wafer or the transfer destination substrate 14 is an insulative inorganic film or a resin sheet other than a resin PES film.

For example, the adhesive layer 13 is made of an acrylic adhesive or an acrylic viscous adhesive. In particular, where the transfer destination substrate 14 and the adhesive layer 13 should be transparent as is the case of a transmission-type flexible display device as described in the following second embodiment, the adhesive layer 13 may be a transparent acrylic adhesive or viscous adhesive or an acrylic adhesive or viscous adhesive that is colored so lightly as to be regarded as substantially transparent because of a small thickness. It is preferable that such an adhesive layer 13 be applied at a uniform thickness.

Next, a manufacturing method of the above flexible electronic device will be described with reference to FIGS. 3-5.

Figure 3:
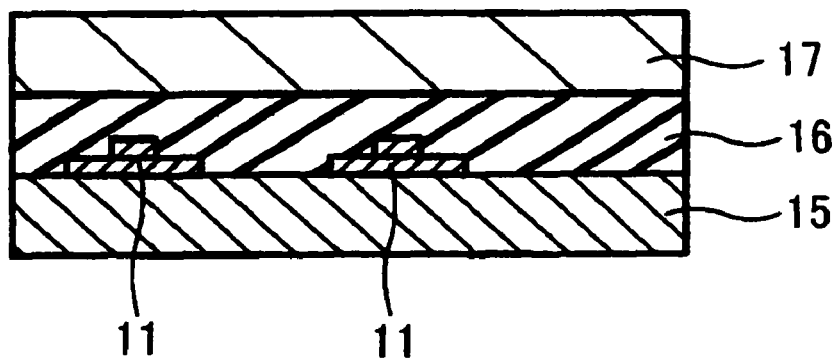
FIG. 3 is a sectional view illustrating a manufacturing method of the flexible electronic device according to the first embodiment.

First, as shown in FIG. 3, a temporary support substrate 17 is bonded, with a temporary adhesive 16, to the front surface of a transfer subject substrate 15 which is a glass substrate whose front surface has been formed with electronic circuits 11 by a general semiconductor process. The temporary support substrate 17 will protect the electronic circuits 11 from an etching acid solution in a step of etching the transfer subject substrate 15 (described later) and will enable handling of the electronic circuits 11 on a thin transfer subject substrate 12 in a bonding step (described later). Therefore, the temporary support substrate 17 should be made of a material that is highly resistant to acid, such as Teflon (registered trademark). Since the temporary support substrate 17 will be peeled off after completion of a transfer step, the temporary adhesive 16 is required to facilitate the peeling of the temporary support substrate 17.

Figure 4:
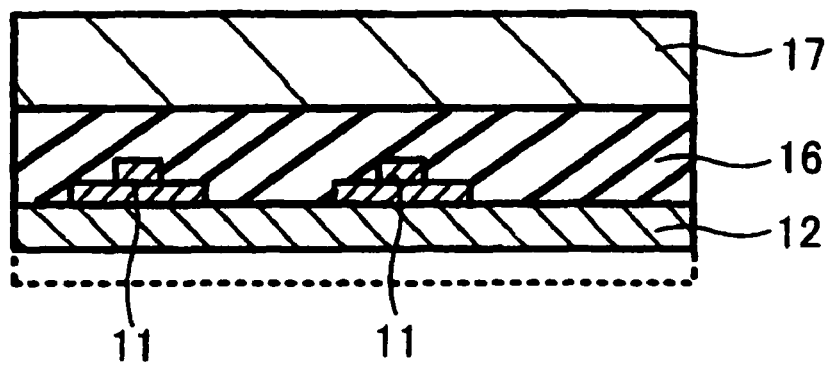
FIG. 4 is another sectional view illustrating the manufacturing method of the flexible electronic device according to the first embodiment.

Then, as shown in FIG. 4, the transfer subject substrate 15 to whose front surface the temporary support substrate 17 is bonded with the temporary adhesive 16 is etched from the back side until it comes to have such a desired thickness as to be flexible, whereby a thin-film transfer subject substrate 12 is formed. For example, the etching is performed with an acid solution of a mixed acid obtained by mixing a strong acid such as hydrochloric acid or nitric acid into hydrofluoric acid.

Figure 5:
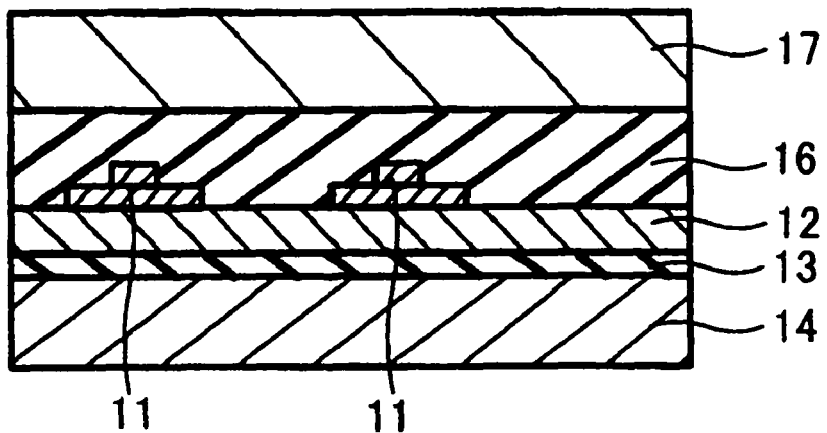
FIG. 5 is a further sectional view illustrating the manufacturing method of the flexible electronic device according to the first embodiment.

After the formation of the thin transfer subject substrate 12, as shown in FIG. 5 the back surface of the thin-film transfer subject substrate 12 is coated with an adhesive layer 13 and the thin-film transfer subject substrate 12 is bonded to a transfer destination substrate 14 with the adhesive layer 13. The adhesive layer 13 which is made of a transparent adhesive or a viscous adhesive or a colored adhesive that is applied so thin as to be regarded as substantially transparent is applied to the back surface of the thin-film transfer subject substrate 12 at a uniform thickness by spin coating or screen printing.

The temporary support substrate 17 is peeled off the thin-film transfer subject substrate 12 which is bonded to the transfer destination substrate 14, whereby a flexible electronic device as shown in FIG. 1 is completed. It is preferable that at this step the temporary adhesive 16 be also removed from the thin-film transfer subject substrate 12. If part of the temporary adhesive 16 remains, it is removed.

As described above, in the first embodiment, the use of the adhesive layer 13 whose elasticity modulus is in the above range makes it possible to almost completely eliminate the thermal stress occurring due to the difference between the thermal expansion coefficients of the transfer destination substrate 14 and the thin-film transfer subject substrate 12. As a result, a highly reliable flexible electronic device can be provided.

Second Embodiment

Next, a flexible display device which is a flexible electronic device according to a second embodiment will be described with reference to FIG. 6.

Figure 6:
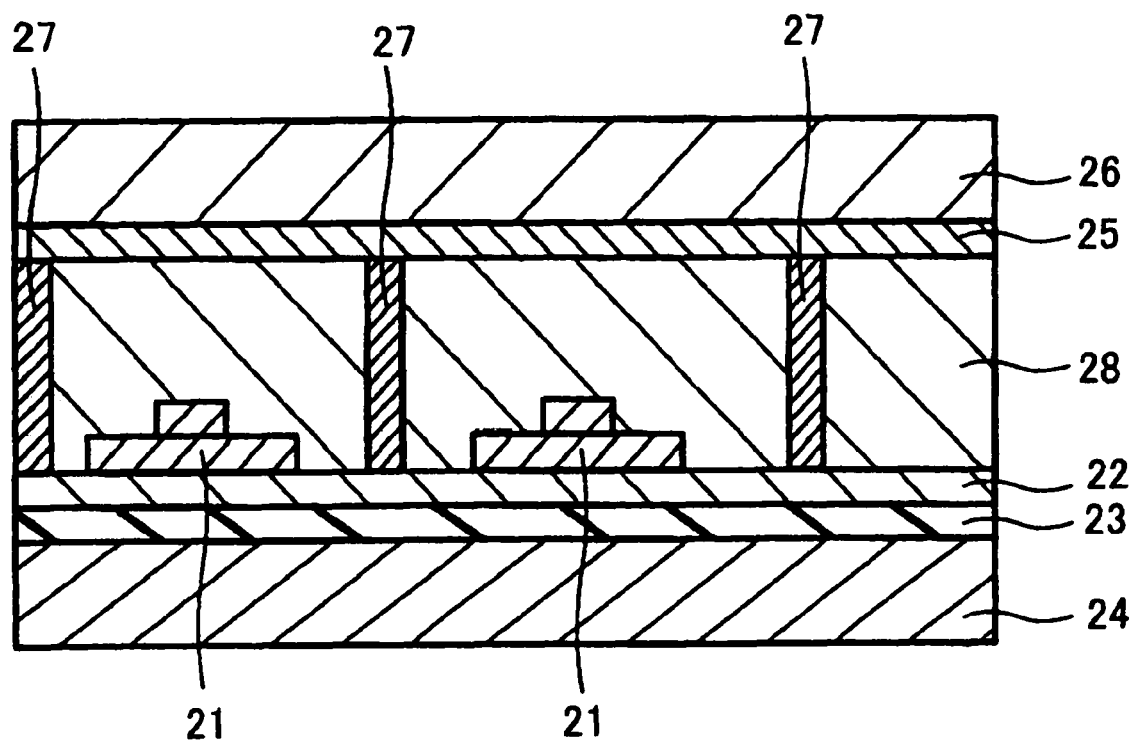
FIG. 6 is a sectional view showing the structure of a flexible display device according to a second embodiment.

FIG. 6 is a sectional view showing the structure of the flexible display device according to the second embodiment.

As shown in FIG. 6, in the flexible display device according to the embodiment, a display-driving thin-film transistor (TFT) array 21 is formed on the front surface of a thin-film transfer subject substrate 22 and the back surface of the thin-film transfer subject substrate 22 is bonded to the front surface of a flexible transfer destination substrate 24 with an adhesive layer 23. As described in the first embodiment, the thin-film transfer subject substrate 22 is so thin as to be flexible. The thickness reduction to form the thin-film transfer subject substrate 22 is performed by etching, melting, peeling, or the like. A transparent, flexible facing substrate 26 the back surface of which is formed with an ITO coat (transparent conductive film) 25 is formed over the front surface of the thin-film transfer subject substrate 22 via spacers 27 in such a manner that the back surface of the facing substrate 26 is opposed to the front surface of the transfer destination substrate 24. A liquid crystal layer 28 occupies the space between the thin-film transfer subject substrate 22 and the facing substrate 26.

In particular, where the flexible display device is a transmission-type flexible display device, the transfer destination substrate 24 should be transparent (transmittance: 85% or more for all light), free of birefringence (retardation: 10 nm or less when it is 100 μm in thickness), and flexible. For example, the transfer destination substrate 24 may be a resin film of PES, COP, or PMMA, or may be a composite film of such resin film and a filler made of glass fiber or the like. On the other hand, in the case of a self-emission type or a reflection-type flexible display device, the transfer destination substrate 24 may be a flexible, insulative film.

The back surface of the thin-film transfer subject substrate 22 is coated, at a uniform thickness, with the adhesive layer 23 whose elasticity modulus is in the range of $1.0 \times 10^3$ to $2.1 \times 10^4$ Pa at 80° C. and which is transparent (transmittance: 85% or more for all light). The thin-film transfer subject substrate 22 is bonded to the front surface of the transfer destination substrate 24 with the adhesive layer 23. For example, the adhesive layer 23 is a transparent acrylic adhesive or viscous adhesive or an acrylic adhesive or viscous adhesive that is colored so lightly as to be regarded as substantially transparent because of a small thickness. Alternatively, the adhesive layer 23 may be made of a silicone gel.

The flexible display device displays a desired image by switching on/off each pixel by controlling, with the TFT, the potential difference across a portion of the liquid crystal layer 28 that is located between a holding electrode (not shown) of the TFT array 21 and the ITO coat 25.

The flexible display device can be constructed by a manufacturing method that is similar to the manufacturing method of the flexible electronic device according to the first embodiment. Therefore, the manufacturing method of the flexible display device will not be described in detail here. After a structure similar to the structure as shown in FIG. 1 is formed, a facing substrate 26 that is formed with an ITO coat 25 is formed over the front surface of the thin-film transfer subject substrate 22 via spacers 27. Then, a liquid crystal layer 28 is injected into the space between the thin-film transfer subject substrate 22 and the facing substrate 26. A flexible display device as shown in FIG. 6 is thus completed.

As described above, in the flexible display device according to the embodiment, the back surface of the thin-film transfer subject substrate 22 is coated with the adhesive layer 23 whose elasticity modulus is in the above range and the thin-film transfer subject substrate 22 is bonded to the front surface of the transfer destination substrate 24 with the adhesive layer 23. Therefore, the thermal stress occurring due to the difference between the thermal expansion coefficients of the transfer destination substrate 24 and the thin-film transfer subject substrate 22 can be eliminated almost completely. As a result, a highly reliable flexible display device can be provided.

Although the embodiments of the invention have been described above, the invention is not limited to those embodiments and can be applied to all electronic devices constructed by what is called the transfer method.

In each embodiment, the adhesive layer 13 or 23 is made of an acrylic adhesive or viscous adhesive or a silicone gel (particularly in the second embodiment). However, the material of the adhesive layer 13 or 23 is not limited to them and may be any material as long as it is used as what is called an adhesive and its elasticity modulus is in the above-described range.

It is to be understood that the invention is not limited to the specific embodiments described above and that the invention can be embodied with the components modified without departing from the spirit and scope of the invention. The invention can be embodied in various forms according to appropriate combinations of the components disclosed in the embodiments described above. For example, some components may be deleted from the configurations described as the embodiments. Further, the components described in different embodiments may be used appropriately in combination.

What is claimed is:

1. An electronic device comprising:
   a thin-film substrate having a front surface being formed with electronic circuits;
   an adhesive layer comprising an adhesive material applied to a back surface of the thin-film substrate, the adhesive material having an elasticity modulus being in a range of $1.0 \times 10^3$ to $2.1 \times 10^4$ Pa at 80° C.; and
   a flexible substrate having a front surface being bonded to the back surface of the thin-film substrate with the adhesive layer,
   wherein the adhesive layer comprises a colored adhesive material and the thin-film substrate in a thickness that causes the adhesive layer to be substantially transparent.

2. The device of claim 1, wherein the adhesive material is an acrylic adhesive or an acrylic viscous adhesive.

3. The device of claim 1, wherein
   the thin-film substrate is an inorganic substrate, and
   the flexible substrate is a resin substrate.

4. A display device comprising:
   a thin-film substrate having a front surface being formed with thin-film transistors;
   an adhesive layer comprising an adhesive material applied to a back surface of the thin-film substrate, the adhesive material having an elasticity modulus being in a range of $1.0 \times 10^3$ to $2.1 \times 10^4$ Pa at 80° C.; and
   a flexible substrate having a front surface being bonded to the back surface of the thin-film substrate with the adhesive layer,
   wherein the adhesive layer comprises a colored adhesive material and thin-film substrate in a thickness that causes the adhesive layer to be substantially transparent.

5. The device of claim 4, wherein the colored adhesive material is an acrylic adhesive or an acrylic viscous adhesive.

6. The device of claim 4 further comprising:
   a facing substrate disposed over the first substrate via spacers;
   a transparent conductive film disposed on a back surface of the facing substrate; and
   a liquid crystal layer being filled between the facing substrate and the thin-film substrate.

7. The device of claim 4, wherein
   the thin-film substrate is an inorganic substrate, and
   the flexible substrate is a resin substrate.

* * * * *